United States Patent [19]
Conrad

[11] Patent Number: 5,391,458
[45] Date of Patent: Feb. 21, 1995

[54] PHOTORESIST PROCESSING FOR IMPROVED RESOLUTION HAVING A BAKE STEP TO REMOVE THE TACKINESS OF THE LAMINATED PHOTOSENSITIVE LAYER PRIOR TO CONTACT IMAGEWISE EXPOSURE

[75] Inventor: Charles T. Conrad, El Toro, Calif.

[73] Assignee: Morton International, Inc., Chicago, Ill.

[21] Appl. No.: 992,934

[22] Filed: Dec. 18, 1992

[51] Int. Cl.⁶ .................... G03C 1/805; G03F 7/38
[52] U.S. Cl. ................... 430/258; 430/260; 430/262; 430/263; 430/273; 430/288; 430/325; 430/327; 430/330
[58] Field of Search .......... 430/257, 258, 273, 281, 430/288, 260, 261, 262, 325, 330, 252, 254

[56] References Cited
U.S. PATENT DOCUMENTS

| | | | |
|---|---|---|---|
| 3,703,373 | 11/1972 | Alsup et al. | 430/330 |
| 3,953,309 | 4/1976 | Gilano et al. | 204/159.16 |
| 4,241,165 | 12/1980 | Hughes et al. | 430/330 |
| 4,530,896 | 7/1985 | Christensen et al. | 430/155 |
| 4,559,292 | 12/1985 | Geissler et al. | 430/273 |
| 4,624,912 | 11/1986 | Zweifel et al. | 430/260 |
| 4,632,897 | 12/1986 | Barzynski et al. | 430/260 |
| 4,725,254 | 2/1988 | Elzer et al. | 430/260 |
| 4,780,392 | 10/1988 | Walls et al. | 430/281 |
| 4,889,790 | 12/1989 | Roos et al. | 430/258 |
| 4,897,337 | 1/1990 | Kato et al. | 430/330 |
| 4,945,032 | 7/1990 | Murphy et al. | 430/394 |
| 5,030,548 | 7/1991 | Fujikura et al. | 430/281 |
| 5,208,134 | 5/1993 | Maruyama et al. | 430/271 |

OTHER PUBLICATIONS

Coversheet14 Free Exposure of Dry Film Resist, G. S. Cos & G. C. Weed *PC FAB* Nov. 1991 pp. 52–56.

*Primary Examiner*—Charles L. Bowers Jr.
*Assistant Examiner*—John S. Chu
*Attorney, Agent, or Firm*—Wayne E. Nacker; Gerald K. White

[57] ABSTRACT

A method is provided for forming a high-resolution photoresist layer on a substrate, such as a metal-clad circuit board blank. A dry film is used which comprises a support sheet, a negative-acting, alkaline aqueous developable photoresist layer in direct contact with the support sheet, and a protective sheet. The protective sheet is removed and the photoresist layer is cut sheet laminated to the substrate. Then the support sheet is removed. The photoresist layer is baked until its exposed surface is non-tacky. Artwork is laid directly in contact with the non-tacky exposed surface, and the photoresist layer is exposed to actinic radiation through the art work. The photoresist layer is then developed in alkaline aqueous solution. The photoresist layer is highly resolved. Subsequent processing steps, such as plating or etching and stripping yield a printed circuit board having highly resolved lines and spaces. Photoresists of specific formulation are found to be bakeable to a non-tacky surface with minimal loss of photospeed.

2 Claims, 2 Drawing Sheets

PHOTORESIST PROCESSING FOR IMPROVED RESOLUTION HAVING A BAKE STEP TO REMOVE THE TACKINESS OF THE LAMINATED PHOTOSENSITIVE LAYER PRIOR TO CONTACT IMAGEWISE EXPOSURE

The present invention is directed to an improved process for processing dry film photoresists, such as primary imaging photoresists, used in the manufacture of electronic circuit boards.

BACKGROUND OF THE INVENTION

In a common method of preparing a printed circuit board, a primary imaging photoresist is applied as a dry film to a circuit board blank. The blank is typically a copper-clad epoxy board. A common dry film consists of a cover or support sheet, typically formed of a polyester, such as polyethyleneterephthalate (PET), a layer of photoimageable composition (photoresist) and a removable protective sheet. The support sheet is of a thickness that gives the dry film shape, allowing the dry film to be rolled into a reel and subsequently be applied flat to the circuit board blank. The protective sheet is formed of a material, such as polyethylene, which is easily removed from the photoresist layer. To apply the resist layer to the circuit board blank, the protective sheet is removed, and the somewhat tacky resist layer is laminated to the copper-clad blank. An artwork is then laid over the support sheet, which remains on the photoresist layer, and the photoresist layer is exposed to actinic radiation through the artwork and through the support sheet. Using photoresists of the type to which the present invention is directed, i.e., negative-imaging, alkaline aqueous developable resists, the exposed portions of the photoresist become insoluble in alkaline aqueous developer while the unexposed portions remain soluble in alkaline aqueous developer. Following exposure, the support sheet is removed, and the photoresist layer is developed in alkaline aqueous developer which washes away the unexposed portions of the photoresist layer. Subsequently, the blank is etched or plated in the portions from which the photoresist is removed, thereby forming the printed circuitry. Generally, as a final step, the remaining photoresist is stripped from the printed circuit board.

There is a continual desire to obtain printed circuit boards with higher resolution, i.e., narrower resolved lines and spacing. For photoresists applied as a dry film in the above-described manner, an inherent limitation to resolution is the thickness of the support sheet. Generally the support sheet limits resolution by a dimension approximating its thickness.

The resolution loss could be eliminated if the support sheet could be removed prior to exposure and the artwork or photo tool laid directly on the photoresist layer. Unfortunately, most dry film photoresists are tacky and tend to stick to the artwork. In many cases the tackiness is so severe that on-contact printing, the process of placing the artwork in intimate contact with the photoresist layer, is nearly impossible. Sticking of the photoresist layer to the artwork makes registration difficult and after repeated applications, the artwork becomes degraded with resist residue. Also, the photoinitiators typically used in photoresists are subject to oxygen inhibition; and photospeed of the photoresist deteriorates rapidly upon support sheet removal. Accordingly, when using dry films of the type described above, it is normal practice to expose the photoresist layer through the support sheet. Advantages and limitations of coversheet-free exposure are discussed in "Coversheet-Free Exposure of Dry Film Resist", G. S. Cox and G. C. Weed, *PC FAB*, November 1991.

One approach to forming a dry film which permits removal of the support sheet, direct contact with artwork, and exposure without the cover sheet is described, for example, in U.S. Pat. No. 4,530,896 to Christensen et al. Interposed between the support sheet and the photoresist layer is a thin intermediate layer of non-tacky material, such as polyvinyl alcohol, which allows artwork to be laid directly thereontop. The intermediate layer, which overlies the photoresist layer, even after support sheet removal, furthermore provides an oxygen barrier, protecting the photoinitiator in the photoresist from oxygen inhibition. While the intermediate layer eliminates the need for exposure through the relatively thick support sheet (typically 0.7–1.1 mils), the intermediate layer adds some thickness (typically 0.1–0.5 mils), increasing the light path from the artwork and inherently limiting resolution by light scattering, refraction, interfacial reflections, etc. This type of intermediate layer adds additional cost. LAMINAR UF is an example of such a photoresist that incorporates an intermediate layer into the normal construction of the dry film photoresist. Accordingly, it would be desirable to provide contact exposure in a conventional dry film that consists of a support sheet, a photoresist layer and a protective sheet. In the case the intermediate layer is substantially tack free and greatly reduces oxygen inhibition during a photopolymeric reaction.

SUMMARY OF THE INVENTION

The invention is directed to a process for using a dry film in which a layer of negative imaging, alkaline aqueous developable photoresist is in direct contact with a support sheet and also has a removable protective sheet. The protective sheet is removed and the photoresist layer is laminated to a substrate, typically a blank which is a copper-clad epoxy panel. The support sheet is removed. The photoresist layer is then baked at mild conditions which renders it non-tacky. Artwork is laid directly on the baked photoresist layer, and the photoresist layer is then exposed to actinic radiation. The photoresist layer is developed in alkaline aqueous solution, and a printed circuit board is then formed by common subsequent procedures, such as plating or etching and stripping.

It is a preferred embodiment of the invention to utilize a dry film having a photoimageable layer which, when exposed to oxygen after support sheet removal, loses photospeed by no more than about 1 to 2 steps on a 41 step Stouffer step. Whereas most photoresists lose about 6 or more steps on a 41 step Stouffer step upon exposure to oxygen, a photoresist formulation is provided herein which loses no more than about 2 steps on a 41 step Stouffer step and which can be baked to non-tackiness to allow for direct artwork contact with the photoresist layer.

DETAILED DESCRIPTION OF CERTAIN PREFERRED EMBODIMENTS

Figure 1:
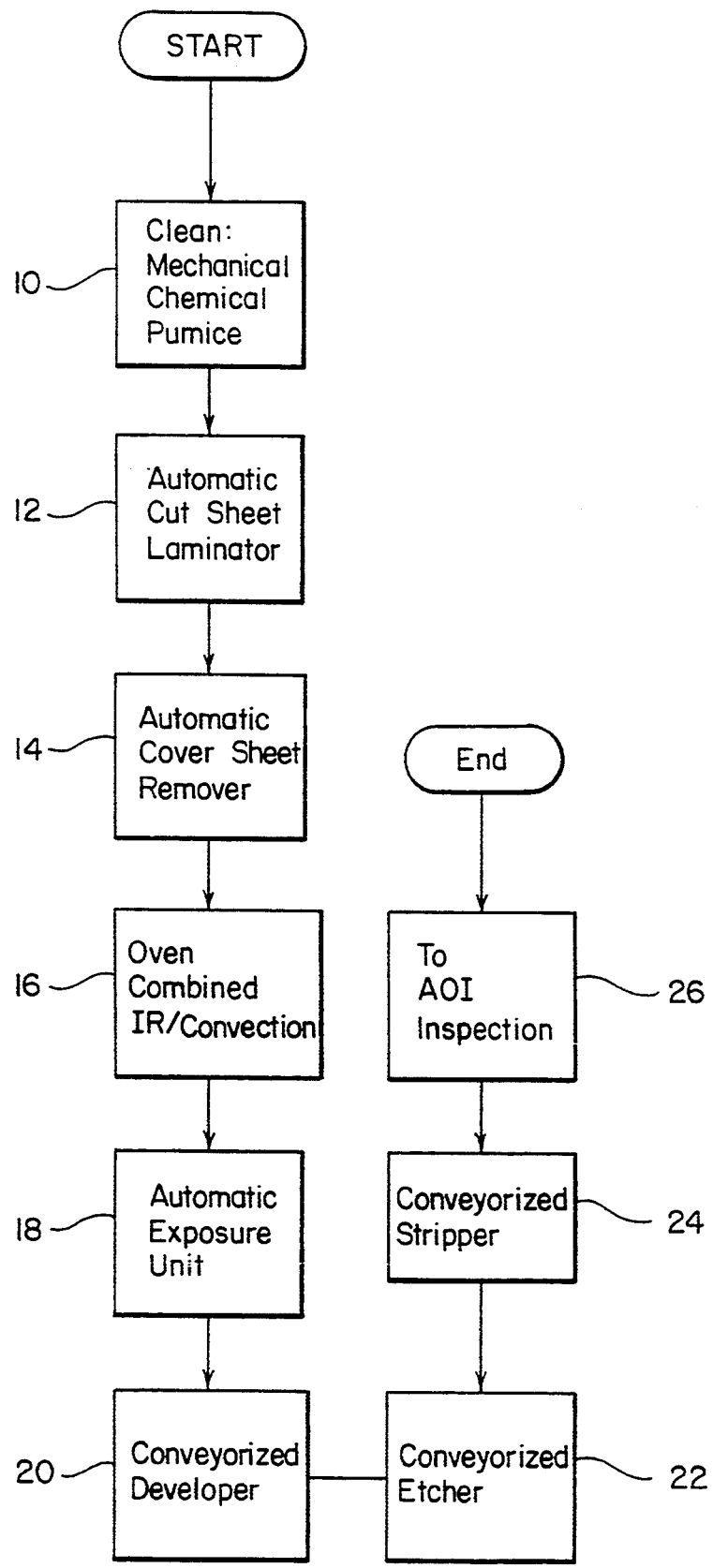
FIG. 1 is a block diagram of in-line processing apparatus for producing a printed circuit board in a print and etch process in accordance with the present invention.

In accordance with the invention, it is found that when using a dry film in which the photoresist layer is negative-imaging, alkaline aqueous developable, following lamination e.g. cut sheet lamination, of the photoresist layer to a circuit board blank, the support sheet may be removed, the laminate baked to render the exposed surface of the photoresist layer non-tacky, and artwork laid in-contact with the non-tacky photoresist layer surface so that exposure can be through the artwork directly in contact with the photoresist layer. Exposure, development in alkaline aqueous solution, etching or plating, and stripping follow in normal sequence. Substantially improved resolution of the exposed and developed photoresist layer is achieved, relative to exposing either through a support sheet or through an intermediate layer. This enhanced resolution allows a more finely resolved printed circuit board to be produced. It is further found that a photoresist of specific formulation, set forth hereinafter, when processed in accordance with the present invention, can be baked to non-tackiness and loses no more than about 2 steps of a 41 step Stouffer step scale in photospeed.

The novel processing step of the present invention is the baking step which allows the support sheet to be removed prior to exposure, artwork to be laid directly on the non-tacky exposed surface of the photoresist layer, and exposure to actinic radiation to be by contact printing with the artwork in intimate contact with the photoresist layer. Other processing steps for forming a printed circuit board are conventional, e.g., as described in U.S. Pat. No. 3,953,309, the teachings of which are incorporated herein by reference.

Baking of the laminated photoresist layer is under relatively mild conditions, i.e., sufficient to render the exposed surface of the laminated photoresist layer non-tacky, yet still processable in the normal manner. To a greater or lesser degree, depending upon the specific formulation of the photoresist layer, exposure to oxygen and baking will affect photospeed. Baking is done at between about 125° and about 250° F. preferably between about 150° and about 225° F., most preferably between about 150° and about 200° F. Baking time depends on the temperature used, the specific formulation, and the thickness of the photoresist layer. It may also depend upon the manner in which the photoresist layer is heated. A quick pass by a heat source providing a relatively high temperature which acts primarily at the exposed surface to render it non-tacky may be preferred. It is believed to be within the skill of one with ordinary skill in the art to optimize specific heating conditions for a photoresist layer of particular formulation and thickness.

The invention is now described in greater detail by way of specific examples.

Testing relative to this invention was performed as per the following examples. Several commercial Dynachem dryfilm photoresists as well as several other commercial dry film competitive resists were investigated. The dry films were applied to mechanically scrubbed clean copper clad epoxy panels using a Dynachem Model 300 Hot Roll Laminator. The rolls were set for a temperature of 235° F. and 40 psi assisted air pressure. The laminating speed was 3 feet per minute. These are standard conditions for applying dry film photoresist in the printed wiring and printed circuit industry.

The laminated photo resist was exposed to UV light with a photo tool placed in contact with the polyester support sheet per standard practice as a control for all tests. The new procedure places the photo tool directly in contact with the laminated, and baked resist.

Developing was done in a solution of 1% by weight of sodium carbonate monohydrate and a temperature of 85° F. to 95° F. This solution was sprayed on the exposed resist by a machine designed to transport the workpiece through the sprays of developer solution and sprays of water to rinse the developer solution from the panel. The unexposed resist is removed by this solution and the UV cross-linked resist remains. The unexposed resist was removed 50% to 60% of the way through the developing chamber. The standard procedure removes the polyester support sheet just before the developing process. The new procedure removes the support sheet previously before the exposure process.

It was determined that Dynachem L-W214 dryfilm photoresist had the property after an appropriate bake cycle that there was no tackiness to cause artwork sticking during exposure, nor was there a significant loss in photo sensitivity to interfere with the imaging process. Other films tested displayed either excessive tackiness, substantial loss of photospeed or both.

Figure 2:
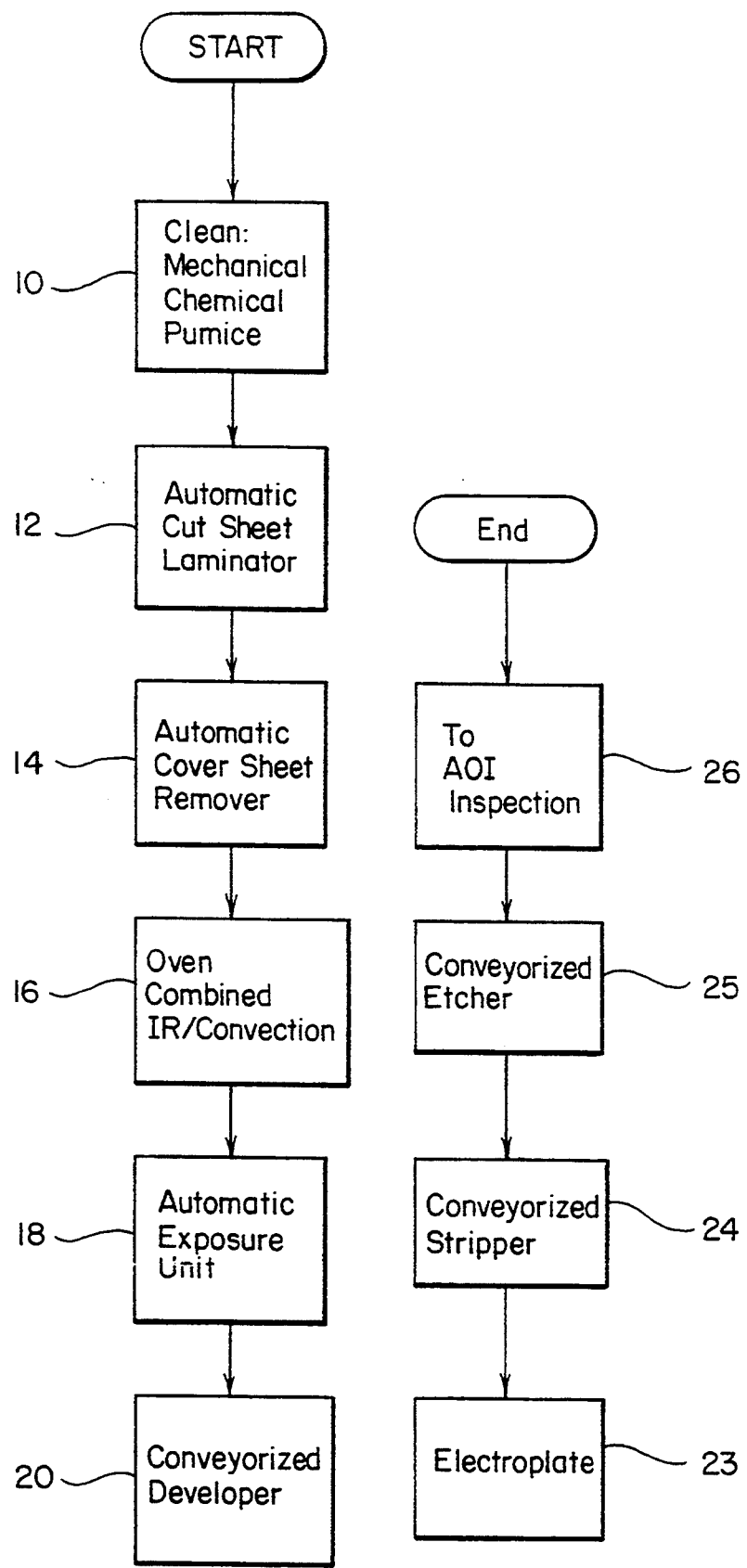
FIG. 2 is a block diagram of in-line processing apparatus for producing a printed circuit board in a plating process in accordance with the present invention.

The pre-development baking step in accordance with the invention may be effected in a pass-through oven through which a circuit board blank having a laminated photoimageable layer is transported by conveyer. This allows for a printed circuit board to be formed in an automated process. Referring to FIGS. 1 and 2, block diagrams for print and etch (FIG. 1) and plating (FIG. 2) processes in accordance with the invention are shown. For identical components of each process, the same numeral designations are used.

In both processes, the metal surface of the blank is mechanically and chemically cleaned at a cleaning unit 10. After the protective sheet is removed from the dry film, the photoimageable composition layer is laminated to the panel at an automatic cut sheet laminator 12. The cover sheet is removed by an automatic cover sheet remover 14. Next, the laminate is passed through an oven 16, e.g., a combined IR/Convection oven. In an Automatic Exposure Unit 18, artwork is laid directly on the photoimageable composition layer and the photoimageable composition layer is exposed to actinic radiation, usually UV light. The exposed laminate is carried by conveyor through a developer 20 which removes the non-exposed portions of the photoimageable layer, exposing the metal in those portions.

In the print and etch process (FIG. 1), the blank is conveyed through an etcher 22 which etches away the exposed metal, thereby printing the circuit board. The board is conveyed through a stripper 24 which removes the remainder of the exposed photoimageable composition layer and then through an automatic optical inspection station (AOI) 26.

In the plating process (FIG. 2), the blank is conveyed through an electroplate unit 23 which plates a tin/lead layer on the exposed metal. The board is then conveyed through a stripper and through an etcher 25 which removes the metal from the blank in regions not covered with the tin/lead layer. Finally the board is inspected at an AOI 26.

L-W214 primary imaging resist is formulated as follows:

| Material: | Description | Wt. % based on solids |
|---|---|---|
| Binder | Binder polymer A | 35.8 |
| | Binder Polymer B | 19.9 |
| | | 55.7 |
| Monomer system | Ethyoxylated TMPTA | 18.0 |
| | Neopentyl glycol-propoxylated diacrylate | 18.0 |
| | TMPTA | 1.4 |
| | | 37.4 |
| Photo Initiators | Benzophenone | 1.4 |
| | Chlorothioxanthione | 0.7 |
| | Ethyl p-dimethylamino benzoate | 2.2 |
| | | 4.3 |
| Color system | Leuco Crystal Violet | 0.9 |
| | Baso Blue | 0.02 |
| | Other | 0.6 |
| Minor Ingredients | Adhesion Promoters | 0.04 |
| | Stabilizers | 1.05 |
| | Surfactants | 0.15 |

TMPTA = trimethylol propane triacrylate
Polymer A is a polymer formed from 46.6 wt. % methylmethacrylate, 20.1 wt. % n-butyl acrylate, 14.0 wt. % styrene and 19.3 wt. % methyl acrylic acid. It has a molecular weight (Mw) of 115,000 and an acid number of 125.
Polymer B is a polymer formed from 70.4 wt. % styrene and 29.6 wt. % acrylic acid. It has a molecular weight (Mw) of 22,000 and an acid number of 239.

EXAMPLE 1

L-W214, 1.3 mil thick, was evaluated to determine if removing the polyester support sheet prior to exposing would improve the resolution without losing photo speed; that is, to obtain the same cross link density with the same exposure time. Exposure was done on an Optibeam 6000 exposure unit which provides collimated UV light to the work piece. A silver halide photo tool was used to provide the test pattern. The silver halide emulsion was on a 7 mil polyester base. A Stouffer 21 step density tablet was used to measure the cross linking or exposure cure. The results proved the cure was equal or better with a reading of copper or clear metal Step 11 compared to Step 10 when the polyester support sheet was left on the resist. The 1.3 mil L-W214 with support sheet removed prior to exposure resolved a test pattern that was approximately 20 microns finer in features than was achieved with a standard dryfilm process in the normal way (imaging through the support sheet). A problem was encountered, however, with the resist sticking to the photo tool when the support sheet was not in place as a barrier. This causes a problem with registration of the phototool as well as quickly degrading the phototool with resist residue.

EXAMPLE 2

This test was designed to determine the stability of L-W214 in photospeed when the support sheet was removed and to determine if heat would harden the surface of the resist and eliminate the problem of resist sticking to the phototool. The support sheet was removed from 3 panels laminated with L-W214 1.3 mil thick resist. Two of these panels were baked in a Blue M oven for 30 minutes at 180° F. One of the baked panels was put in a rack with the unbaked panel and held for 1½ hours before exposing to UV light. One of the baked panels was allowed to cool to room temperature and then exposed to UV light. A control panel of L-W214 1.3 was processed with each of the baked panels. This bake was successful in eliminating the problem of resist sticking to the phototool and the exposure speed was equal to the control panels. Holding the panel after bake for 1½ hours did not result in the resist becoming tacky and sticking to the artwork and the exposure speed was equal to the control.

EXAMPLE 3

The polyester support sheet was removed from 3 panels of L-W214 1.3 which were then baked at 180° F. for 30 minutes. The panels were allowed to cool to room temperature and exposed on optibeam 6000 through the glass for 12 seconds, 17 seconds, 24 seconds using a silver halide test artwork. An additional panel that had the polyester removed was similarly baked and exposed on the optibeam for 12 seconds using a diazo electrical test artwork that has 2/2, 5/2, 3/3, 4/4 etc. lines/spaces. This test artwork has lines passing between round pads and square pads. We have not previously been able to clear the 2 mil or 3 mil space between these pads and 5 mil lines.

Developing was done in 1% $Na_2CO_3 \cdot H_2O$, at 95° F. and 50% breakpoint-speed 5.4 ft/min.
Results: Silver Halide Artwork

| Exposure | Etch Pattern | Plating Pattern |
|---|---|---|
| 12 seconds = step 10+/29 | 50:50 good | 60:60 good |
| 17 seconds = step 12/32 | 50:50 good | 70:70 good |
| 24 seconds = step 13/37 | 50:50 good 60:60 good | 80:80 almost, 90:90 good |

Results: Diazo Artwork

| Exposure | Etch Pattern |
|---|---|
| 12 seconds | 5/2 almost (more etching would resolve or etch clean 5/3 good, 2/2 almost (more etch would do) |

EXAMPLE 4

This test example was designed to determine if improved resolution could be achieved with a less collimated light source. This test consisted of exposure on ORC model HMW201B using the diazo electrical test artwork with line/spaces between round and square pads to see if 5/3 line/space or better can be achieved. This experiment compared the HMW (a less collimated unit) with previous experiments on the Optibeam (a more collimated unit.)

The polyethylene terephtalate (PET) support sheet was removed after lamination and the panels with resist were baked at 180° F. for 30 minutes for test panels. The control was processed normally leaving the polyester support sheet intact until after exposure.
Exposure Results: Exposure through glass of vacuum frame.

| PANEL | EXPOSURE | STEP |
|---|---|---|
| Control | 30 mj | 22 on 41 density scale |
| Test | 30 mj | 18 |
| Repeat Test | 30 mj | 19 |

-continued

| PANEL | EXPOSURE | STEP |
| --- | --- | --- |
| Control | 20 mj | 20 |
| Test | 20 mj | 15 |

Exposure conclusions:
Test panel at 20 mj, a 5 step loss 30 mj, a 3 steps loss (3 steps=approx. 1 step on a 21 scale)
Resolution Results:

| PANEL | RESOLUTION | COMMENTS |
| --- | --- | --- |
| Control @ 35 | 3/5, 4/5, 5/5 | Step wedge appears to interfere with spaces smaller than 5 lines. Spaces farther away from step wedge clean at 3 mil/space. |
| Test @ 35 | 2/2, 3/3, 4/4, 5/3 | 5 mil and larger spaces good. 5/2 good away from step wedge. |
| Control @ 50 | | 4 mil space good all lines 3 mil space away from step wedge good |
| Test @ 50 S | | Step 19-3 mil spaces good (slight under etch, 2/2 and 5/2 away from step wedge good). |
| Repeat test @ 50 | | Step 18-same as step 19. |

Three additional test panels were exposed without step wedge and at 30, 40, and 58 mj. This should increase step from 19 to 22, 25, and 28.
Results:

| PANEL | COMMENTS |
| --- | --- |
| 30 mj | Under etched but 2 mil space would etch 3 space is clean. |
| 40 mj | 2 mil would etch (same as 50 c). |
| 58 mj | 5/2 bridged, 2/2 would etch, 3 mil space clean. |

EXAMPLE 5

1.0 mil, 1.3 mil, 1.5 mil and 2.0 mil L-W214 were processed using the method of removing polyester, baking 40 minutes at 180° F., cooling to room temp, exposing on HMW201B to copper step 27–28 on 41 step tablet, and developing at 95° F. and 50%BP. Electrical test artwork was used with 1/s between round and square pads.

| PANEL | EXPOSURE | STEP 41 SCALE |
| --- | --- | --- |
| L-W214 1.0 Control | 47 mj | cu 27 |
| L-W214 1.0 Bake | 47 mj | cu 22 |
| L-W214 1.3 Control | 47 mj | cu 27 |
| L-W214 1.3 Bake | 47 mj | cu 25+, 26 clean |
| L-W214 1.5 Control | 52 mj | cu 27 |
| L-W214 1.5 Bake | 52 mj | cu 25 |
| L-W214 2.0 Control | 64 mj | cu 27 |
| L-W214 2.0 Bake | 64 mj | cu 26 |

Developing was at 95° F. in 1% $Na_2CO_3H_2O$ - 50% Breakpoint
Developing time: L-W214 1.0=15 sec. breakpoint total 30 seconds conveyor speed=6.9 ft/min
L-W214 1.3=19 sec. breakpoint=38 seconds total conveyor speed=5.4 ft/min
L-W214 1.5=22 sec. breakpoint=44 seconds total conveyor speed=4.7 ft/min
L-W214 2.0=29 sec. breakpoint=58 seconds total conveyor speed=3.6 ft/min
Resolution Results:

| PANEL | RESOLUTION |
| --- | --- |
| L-W214 1.0 Bake | 2/2, 5/2 appear clean (smallest l/s conditions on artwork) |
| L-W214 1.0 Control | 2/2, 5/2 bridged, 3/3 some spots questionable, 5/3 bridged, 4/4 and 5/4 clean |
| L-W214 1.3 Bake | 2/2, 5/2 appear clean |
| L-W214 1.3 Control | 2/2, 5/2, 5/3 bridged, 3/3 some bridged, 5/4, 4/4 clean |
| L-W214 1.5 Bake | 2/2, 5/2, 3/3 and 5/3 appear clean |
| L-W214 1.5 Control | 2/2, 5/2 bridged, 3/3 & 5/3 appear clean |
| L-W214 2.0 Bake | 2/2 appears clean, 5/2 bridged in pattern close to step wedge, some questionable spots, 3/3 and 5/3 appear clean |
| L-W214 2.0 Control | 2/2 & 5/2 bridged, 3/3 and 5/3 appear clean |

Line spaces of 2/2 & 5/2 patterns that were resolved or next size line/space pattern were measured. The sample was punched from 4/4 pattern for SEM photos of sidewall. Then the boards were etched in 3N copper chloride etcher. The boards were examined for resolution, the resist stripped and copper line space measured. These panels were 1 oz. copper, 2 mil lines may be lost due to etch factor.
Results:
Artwork Measurement:

| PATTERN | MEASUREMENT | AVE. |
| --- | --- | --- |
| 2/2 | Line 1.90 & 1.98 | 1.94 |
| | Space 1.99 & 1.97 | 1.98 |
| 5/2 | Line 4.78 & 4.77 | 4.78 |
| | Space 2.16 & 2.14 | 2.15 |
| 3/3 | Line 2.91 & 2.91 | 2.91 |
| | Space 3.00 & 3.04 | 3.02 |

C = Control
B = Bake

Resist Measurements:

| RESIST PANEL | PATTERN | MEASUREMENT |
| --- | --- | --- |
| L-W214 1.0 C | 2/2 | Line/Space not resolved |
| | 5/2 | L/S not resolved |
| | 3/3 | Line 3.04; space 2.74 |
| L-W214 1.0 B | 2/2 | 1.48/2.33, |
| | 5/2 | 4.65/2.44 |
| | 3/3 | 2.67/3.34 |
| L-W214 1.3 C | 2/2 | 5/2 not resolved |
| | 3/3 | 3.20/2.68 |
| L-W214 1.3 B | 2/2 | 1.73/2.30, |
| | 5/2 | 4.68/2.33, |
| | 3/3 | 2.74/3.29 |
| L-W214 1.5 C | 2/2 | not resolved |
| | 3/3 | 3.11/2.75 |
| | 5/2 | not resolved |
| L-W214 1.5 B | 2/2 | 1.64/2.50, |
| | 5/2 | 4.64/2.31, |
| | 3/3 | 2.8/3.27 |
| L-W214 2.0 C | 2/2 | not resolved, |
| | 3/3 | 3.06/2.86 |
| | 5/2 | not resolved |
| L-W214 2.0 B | 2/2 | 1.70/2.34, |
| | 5/2 | not resolved |
| | 3/3 | 2.74/3.31 |

ETCHED COPPER LINE RESULTS

| RESIST | COMMENTS |
| --- | --- |
| L-W214 1.0 | 2/2 lost some lines, 5/2 ok, 3/3, 4/4 etc. o.k |
| L-W214 1.3 | 2/2 o.k., lost some 2/4, 2/5, rest o.k. |
| L-W214 1.5 | Same as L-W214 1.3 |
| L-W214 2.0 | 2/2 o.k., lost some 2/4, 2/5 |

These were all baked samples. Control panels similar except 2/2 & 5/2 not resolved.

EXAMPLE 6

This example was conducted to determine the degree of tack free surface and the loss of photospeed, before and after the bake process, using L-W214 and other competitive dry film photoresists. Laminar HG 1.0, UF 1.0, Riston 9015, 4820, 4916, Aquamer CF and L-W214 1.0 were laminated. Normal exposure was established on HMW201B to obtain Cu 27 on 41 step tablet. Polyester was pulled off HG, Riston 9015, 9820, 4916, CF & L-W214. Bake was 30 min. at 180° F. Breakpoint time was established for each resist. HG, UF, all Riston and CF developed at 85° F. in a Chem Cut CS 413 unit with 1% $Na_2CO_3 H_2O$. 1 panel of each resist was exposed through polyester for control. An exception was UF which was not baked but polyester is removed before exposure as its normal process. L-W214 1.0 was 1 panel only. Polyester was removed, baked 30 min. at 180° F., then exposed as established in the previous test.
Results:

| RESIST | EXPOSURE | STEP |
| --- | --- | --- |
| HG Control | 65 mj | cu 27+ |
| HG Test | 65 mj | cu 19 |
| UF | 65 mj | cu 27 |
| R4916 Control | 47 mj | cu 29 |
| R4916 Test | 47 mj | cu 18 |
| R9015 Control | 64 mj | cu 25 |
| R9015 Test | 64 mj | cu 17 |
| R4820 Control | 50 mj | cu 27 |
| R4820 Test | 50 mj | cu 19 |
| CF1.5 Control | 64 mj | cu 27 |
| CF1.5 Test | 64 mj | cu 21 |
| L-W214 1.0 Test | 47 mj | cu 20 |

Note: All Riston films were tacky after bake & cool to room temp. HG was tacky also, CF slightly tackier than L-W214.

EXAMPLE 7

Aquamer CF and L-W214 1.5 mil films were compared using removal of polyester support sheet and a bake cycle of 30 minutes at 180° F. The panels were cooled to room temperature for a minimum of 15 minutes. The exposure of the CF was doubled to achieve same step achieved when CF is exposed with polyester left on per normal processing. Exposure of L-W214 was the same for normal processing. Exposure of L-W214 was the same for normal process and the bake process. L-W214 was developed in 1% $Na_2CO_3 H_2O$, at 95° F. & 50% breakpoint. CF was developed in 1% $Na_2CO_3 H_2O$, at 85° F. & 50% breakpoint. This is normal developing for both resists.
Results:
Exposure on HMW201B through the glass.
Note: CF resist unexposed areas turned to a purple color on the baked panel. The color was similar to aged CF. The control panel did not have this color change.

Note: L-W214 was developed in a Chem Cut CS 413. Breakpoint time was 20 seconds and total develop time 40 seconds. Conveyor speed was 56 in/min. CF was developed in Hollmuller. Breakpoint was 16 seconds, conveyor speed was 6.4 ft/min. Total 32 seconds.
Exposure Results:

| RESIST | EXPOSURE | STEP |
| --- | --- | --- |
| CF Control | 64 mj | cu 27 |
| Test | 128 mj | cu 31 |
| L-W214 Control | 52 mj | cu 27 |
| Test | 52 mj | cu 28 |

Resolution Results:

| RESIST | COMMENTS |
| --- | --- |
| CF Test | 2/2, 5/2 bridged, 3/3 & 5/3 some spaces bridged, 4 mil sp & larger OK. |
| CF Control | 2/2 & 5/2 bridged, 3/3 & 5/3 and larger spaces ok. |
| L-W214 Control | 2/2 & 5/2 bridged, 3/3 ok, 5/3 maybe ok, 4 mil sp & larger OK. |
| L-W214 Test | 2/2 & 5/2 and all larger spaces good. |

EXAMPLE 8

This test was conducted to determine how stable L-W214 was for extended holding times after the bake process and to access the degree of oxygen inhibition with respect to the photo polymerization process. Hold time over a weekend was examined. L-W214 1.5 mil was laminated on 4 (9"×12") scrubbed copper panels. The polyester support sheet was removed from 3 panels. 1 of these 3 panels was baked for 30 minutes at 180° F. Then all four panels sat in a rack in yellow light over the weekend. The baked panels were checked for tackiness after approximately 15 minutes cool down to room temperature; tackiness was compared to that of the other panels with the polyester removed. Testing was by touch. One of the unbaked polyester-removed panels was put in the oven for 30 minutes at 180° F. This panel was allowed to cool to room temperature, and then all four panels were exposed on the HMW201B with electrical test artwork having various lines/spaces between pads. The fourth panel was for control and was held with the polyester in tack per normal processing procedures.

Panels were laminated and baked panel were put in the oven. The baked panel was far less tacky than the other panels.
Results:
Tackiness
1. Panel baked & held. No tack—can position artwork with ease. 66 hrs.
2. Panel without bake held. 66 hrs. Tacky—Artwork sticks and is hard to position.
3. Panel held. 65¼ hrs. Baked 30 min. at 180° F. held 15 minutes to cool to room temp—no tack—artwork easy to position.
4. Control—no test—no tackiness to evaluate with polyester sheet intact.

Exposed on HMW201B—Through glass at 90 counts=52 mj. Developed in 1% $Na_2CO_3 H_2O$, 95° F. & 50% Breakpoint in Hollmuller machine. Conveyor speed 4.7 ft/min.
Results:

| RESIST | EXPOSURE SPEED |
| --- | --- |
| L-W214 Control | slight scum 26, clean 27 (41 step guide) |
| RT Test | scum 27, clean 28 |
| Bake & Hold | some scum 26, clean 27 |
| RT Hold & Bake | clean 26 |

All of the new process panels (Polyester removed prior to exposure) have good resolution, i.e. 2/2/, 5/2 and larger spaces developed clean. Control 2 mil. spaces are blocked or bridged with resist. 3/3, and larger look OK.

Test was by flash or microetch in $CuCl_2(3N)$ at full-speed, followed by re-examination.

Results after Microetch—All 3 new process panels developed clean 2/2, 5/2 but the resist did have a positive foot reducing the space slightly. The room temperature held panel only appeared to have less or reduced amount of positive foot. Control had positive foot at 3 mil space.

What is claimed is:

1. A method of preparing a high-resolution exposed and developed photoresist layer on a substrate, the process consisting essentially of performing, in order, the steps of:

providing a dry film comprising a support sheet, a photoresist layer in direct contact with said support sheet and a protective sheet on the side of said photoresist layer opposite said support sheet, said photoresist layer being negative-imaging and developable in alkaline aqueous solution, removing said protective sheet and laminating said photoresist layer to said substrate, removing said support sheet from said laminated photoresist layer, baking said laminated photoresist layer at such time and temperature as to render the exposed surface of said photoresist layer non-tacky, laying art-work in direct contact with said non-tacky exposed surface of said photoresist layer, exposing said photoresist layer to actinic radiation through said artwork in direct contact with said non-tacky surface, and developing said photoresist layer in alkaline aqueous solution.

2. A method according to claim 1 wherein said photoresist comprises about 35.8 wt. % of a first binder polymer formed from methylmethacrylate, n-butyl acrylate, styrene and methacrylic acid, about 19.9 wt. % of a second binder polymer formed from styrene and acrylic acid; a monomer system of about 18.0 wt. % ethyoxylated trimethylol propane triacrylate, about 18.0 wt. % neopentyl glycol-propoxylated diacrylate and about 1.4 wt % trimethylol propane triacrylate; a photoinitiator system of about 1.4 wt. % benzophenone, about 0.7 wt. % chlorothioxanthione and about 2.2 wt. % ethyl p-dimethylamino benzoate; balance minor components; weight percents expressed as percent of total solids.

* * * * *